United States Patent
Lai et al.

[11] Patent Number: 5,969,946
[45] Date of Patent: Oct. 19, 1999

[54] HEAT DISSIPATING ELECTRICAL APPARATUS

[75] Inventors: Ching-Ho Lai, Tao-Yuan Hsien; Wen-Chun Pei, Taipei, both of Taiwan

[73] Assignee: Hon Hai Precision Ind. Co., Ltd., Taipei Hsien, Taiwan

[21] Appl. No.: 08/982,337

[22] Filed: Dec. 2, 1997

[30] Foreign Application Priority Data

Dec. 24, 1996 [TW] Taiwan .................................. 85220104

[51] Int. Cl.$^6$ ..................................................... H05K 7/20
[52] U.S. Cl. .......................... 361/704; 174/16.3; 257/722; 361/710
[58] Field of Search ................................... 165/80.2, 80.3, 165/185; 174/16.3; 257/706–707, 712–713, 718–719, 722, 726–727; 361/688, 690, 704, 707, 709–711, 715–716, 719–720

[56] References Cited

U.S. PATENT DOCUMENTS

| | | | |
|---|---|---|---|
| 3,163,207 | 12/1964 | Schultz | 257/722 |
| 4,769,557 | 9/1988 | Houf et al. | 361/688 |
| 5,748,446 | 5/1998 | Feightner et al. | 361/709 |
| 5,815,371 | 9/1998 | Jeffries et al. | 361/704 |

*Primary Examiner*—Gregory Thompson

[57] ABSTRACT

A heat dissipating electrical apparatus (200) comprises a heat dissipation device (30) mounted to a substrate (99) and fastened to an electrical device (21) mounted on a daughter board (20) received in an electrical connector (10). A plurality of first heat dissipation fins (34) are formed in a matrix arrangement and extend from a main body (31) of the heat dissipation device (30). Two second heat dissipation fins (35) extend from opposite lower corners of the main body (31) of the heat dissipation device (30). The second fins (35) each define holes (36) in free ends thereof corresponding to holes defined in the substrate (99) for receiving fixing elements (40) to stably mount the heat dissipation device (30) to the substrate (99). Alternatively, the second fins (65) extend from an entire lower portion of the main body (61) of the heat dissipation device (60). The second fins (65) are sandwiched between retaining bars (55) and the fixing elements (50) is received in holes (66) defined in each of the outermost second fins (65), the retaining bars (55), and the substrate thereby stably mounting the heat dissipation device to the substrate (99) without exerting a significant force on the electrical connector (10). Therefore, interference with signals of the electrical device is prevented.

7 Claims, 4 Drawing Sheets

HEAT DISSIPATING ELECTRICAL APPARATUS

BACKGROUND OF THE INVENTION

1. Field of the Invention

The present invention relates to a heat dissipating electrical apparatus, and more particularly to a heat dissipating electrical apparatus having a heat dissipation means firmly mounted to a substrate at one end and fastened to a heat emitting electrical device at another end wherein the heat dissipation device does not exert a significant force on the electrical device.

2. The Prior Art

Most computers include at least one heat emitting electrical device requiring a heat dissipation device to absorb excessive heat radiating from the electrical device thereby preventing damage from incurring on the other internal components of the computer. The electrical device could be a central processing unit (CPU) and the heat dissipation device is commonly a large heat sink formed from a metal alloy and mounted near the CPU.

The CPU is commonly mounted on a daughter board which is inserted into a card-type electrical connector mounted on a printed circuit board (PCB) so that the daughter board is orthogonal to the PCB. A bottom surface of the heat sink is fastened to a surface of the CPU. However, the weight of the heat sink causes a strong force to be exerted on the base of the connector which could lead to damage to the structure causing the connector to become loosened from the PCB which results in intermittent connections between the CPU and the other computer components.

The disadvantages described above illustrate that a need exists for an improved heat dissipating electrical apparatus which will not interfere with the internal connections of a computer.

SUMMARY OF THE INVENTION

Accordingly, to resolve the above disadvantages of conventional heat dissipating electrical assemblies, an object of the present invention is to provide an improved heat dissipating electrical apparatus having a heat dissipation means firmly mounted to a substrate at one end and fastened to a heat emitting electrical device at another end thereof so that the heat dissipation device does not exert a significant force on the connector which houses the electrical device thereby preventing interference with the signals of the electrical device.

According to an aspect of the present invention, a heat dissipating electrical apparatus comprises a heat dissipation device having one end mounted to a substrate by a fixing means and another end fastened by a fastening means to a surface of a daughter board received in an electrical connector also mounted to the substrate. A plurality of first heat dissipation fins are formed in a matrix arrangement and extend from a main body of the heat dissipation device. Two second heat dissipation fins extend from opposite lower corners of the main body of the heat dissipation device. The second fins each define holes in free ends thereof corresponding to holes defined in the substrate for receiving the fixing means thereby stably mounting the heat dissipation device to the substrate.

According to another aspect of the present invention, the second fins extend from an entire lower portion of the main body of the heat dissipation device wherein the outermost second fins each define a hole in free ends thereof corresponding to holes defined in the substrate. The second fins are sandwiched between retaining bars so that the holes of the second fins correspond with holes defined in the retaining bars. The fixing means is received in the holes of each of the retaining bars, the second fins, and the substrate so that the retaining bars firmly secure the second fins therebetween and the heat dissipation device is stably mounted to the substrate.

DETAILED DESCRIPTION OF THE PREFERRED EMBODIMENTS

Reference will now be made in detail to the preferred embodiments of the present invention.

Figure 1:
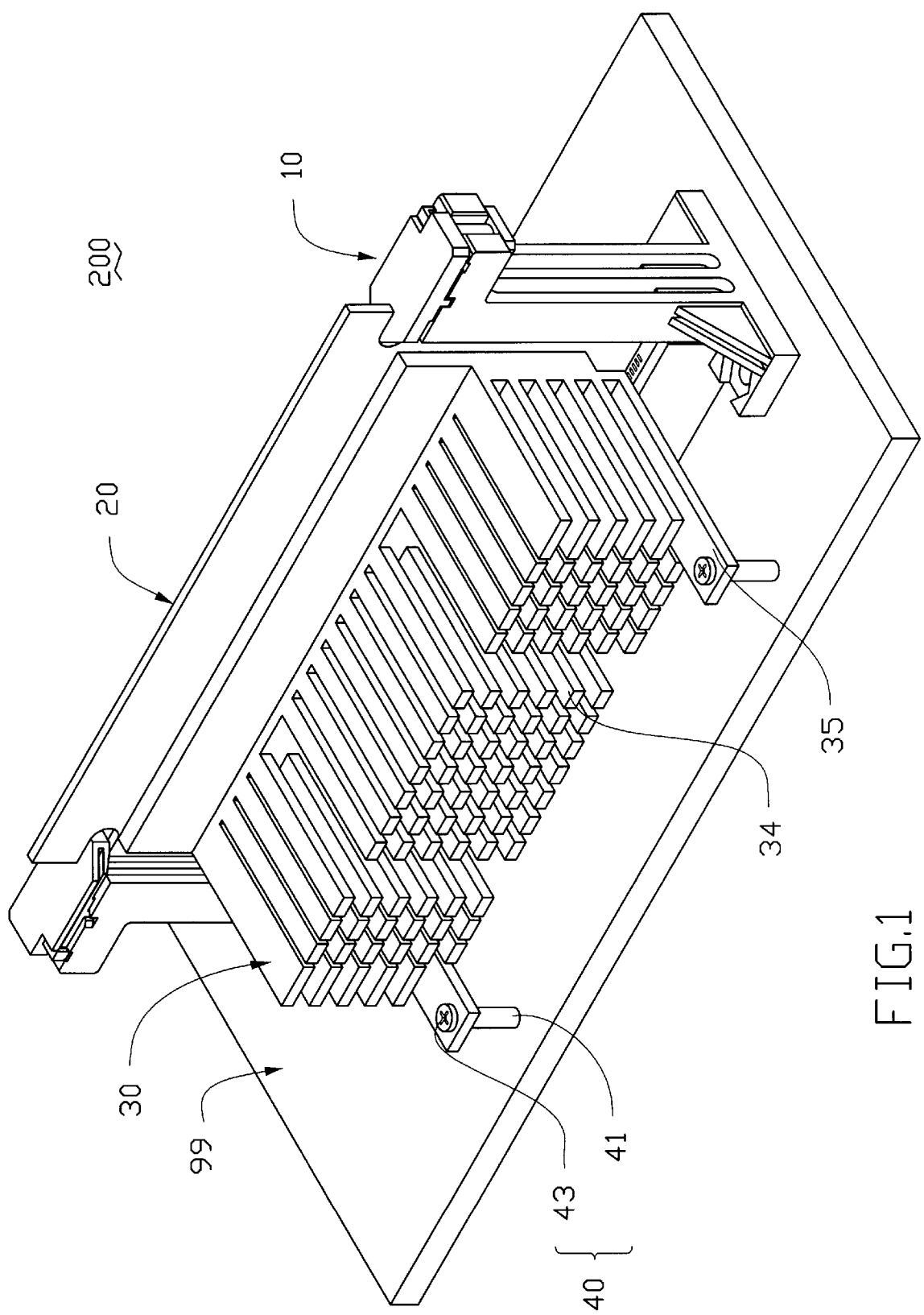
FIG. 1 is a perspective view of the assembled heat dissipating electrical apparatus in accordance with a preferred embodiment of the present invention.
Figure 2:
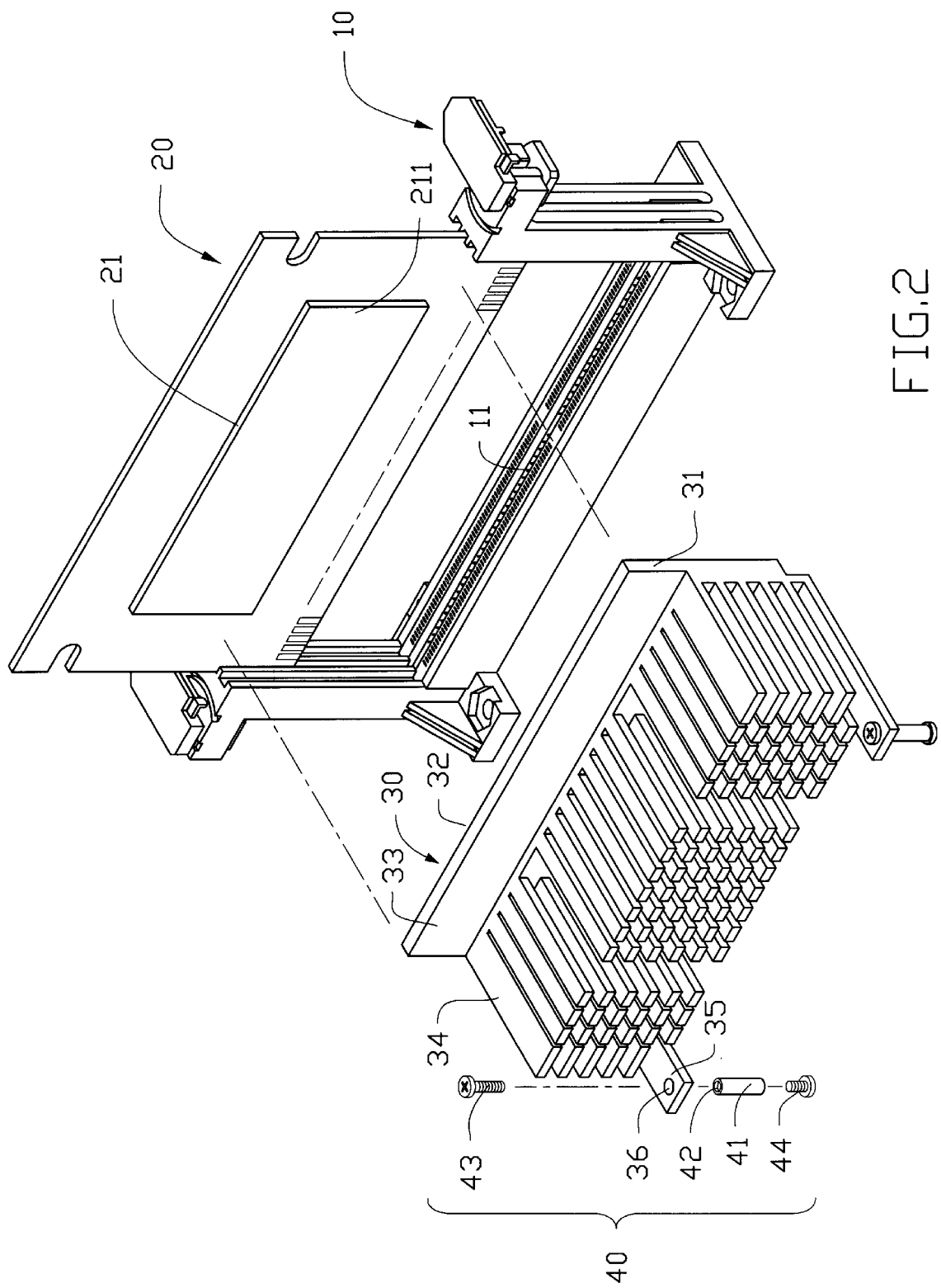
FIG. 2 is a perspective, exploded view of the heat dissipating electrical apparatus in accordance with a preferred embodiment of the present invention.

Referring to FIGS. 1 and 2, a preferred embodiment of a heat dissipating electrical apparatus 200 in accordance with the present invention comprises a heat dissipation device 30, a daughter board 20, a heat emitting electrical device 21, an electrical connector 10, a substrate 99, a fixing means 40 for stably mounting the heat dissipation device 30 on the substrate 99, and a fastening means (not shown) for fastening the heat dissipation device 30 to the daughter board 20.

The heat dissipation device 30 consists of a main body 31 having a first surface 32 and a second surface 33. A plurality of first heat dissipation fins 34 are formed in a matrix arrangement and extend from the second surface 33 of the main body 31 of the heat dissipation device 30. Two second heat dissipation fins 35 extend from opposite lower corners of the second surface 33 of the heat dissipation device 30 wherein the second fins 35 are longer than the first fins 34. The second fins 35 each define a first hole 36 at free ends thereof for receiving the fixing means 40.

The fixing means 40 includes two first screws 43, two second screws 44, two elongate supports 41 each defining a screw hole 42 therethrough, and two second holes (not shown) defined in the substrate 99 at positions corresponding to the first holes 36 of the second fins 35.

In assembly, the heat emitting electrical device 21 having a mounting surface 211 is mounted to the surface of the daughter board 20. The electrical connector 10 defines a slot 11 and receives the daughter board 20 therein, and is mounted on the substrate 99. The first surface 32 of the heat dissipation device 30 is fastened to the mounting surface 211 of the electrical device 21 by means of the fastening means (not shown). The screw holes 42 of the supports 41 are aligned between the first holes 36 of the second fins 35 and the second holes of the substrate 99. The first screws 43 are inserted through the first holes 36 of the second fins 35 for threaded engagement with top portions of the supports 41. The second screws 44 are inserted into the second holes from a bottom surface of the substrate 99 for threaded engagement with bottom portions of the supports 41.

Figure 3:
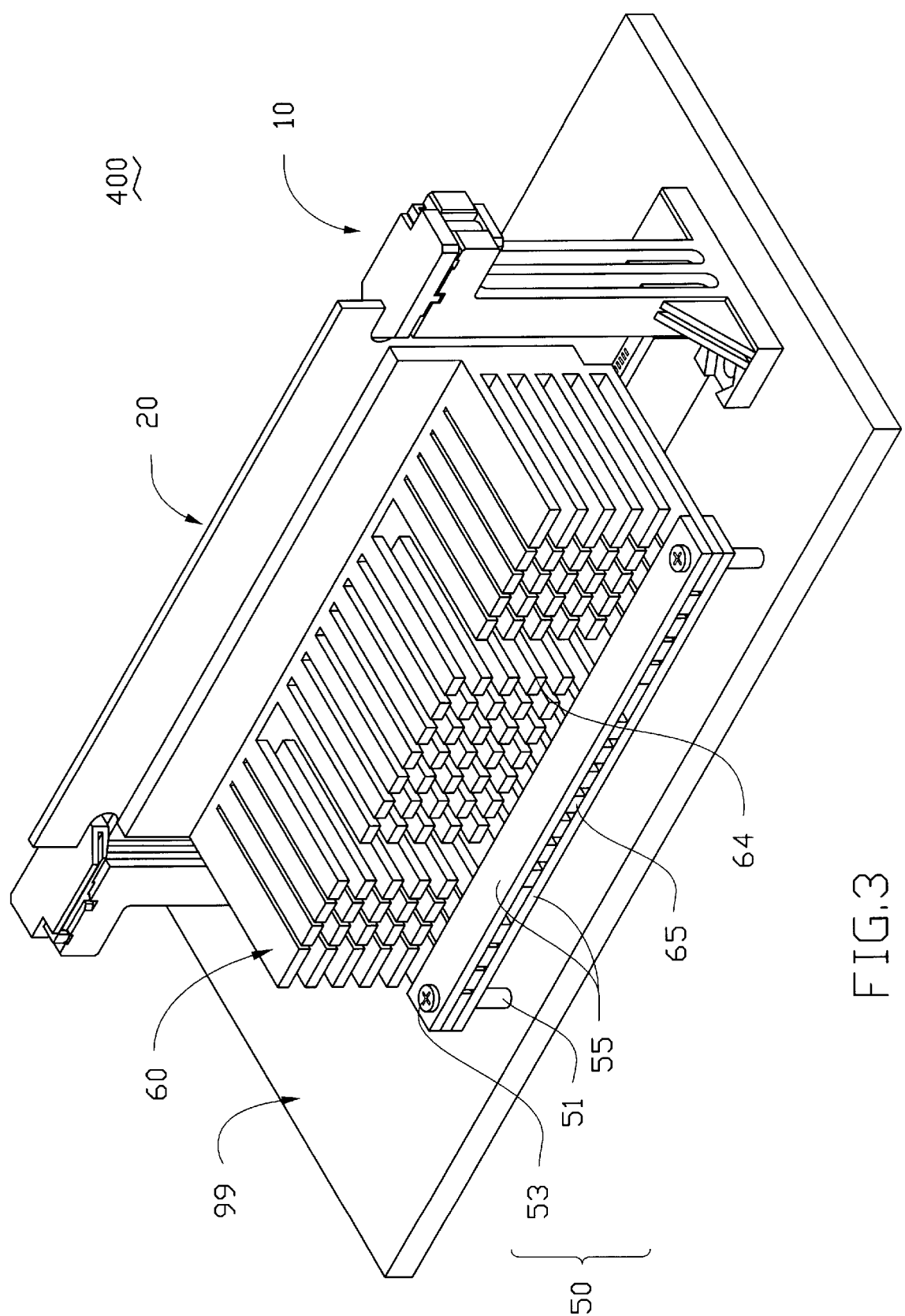
FIG. 3 is a perspective view of the assembled heat dissipating electrical apparatus in accordance with a second embodiment of the present invention.
Figure 4:
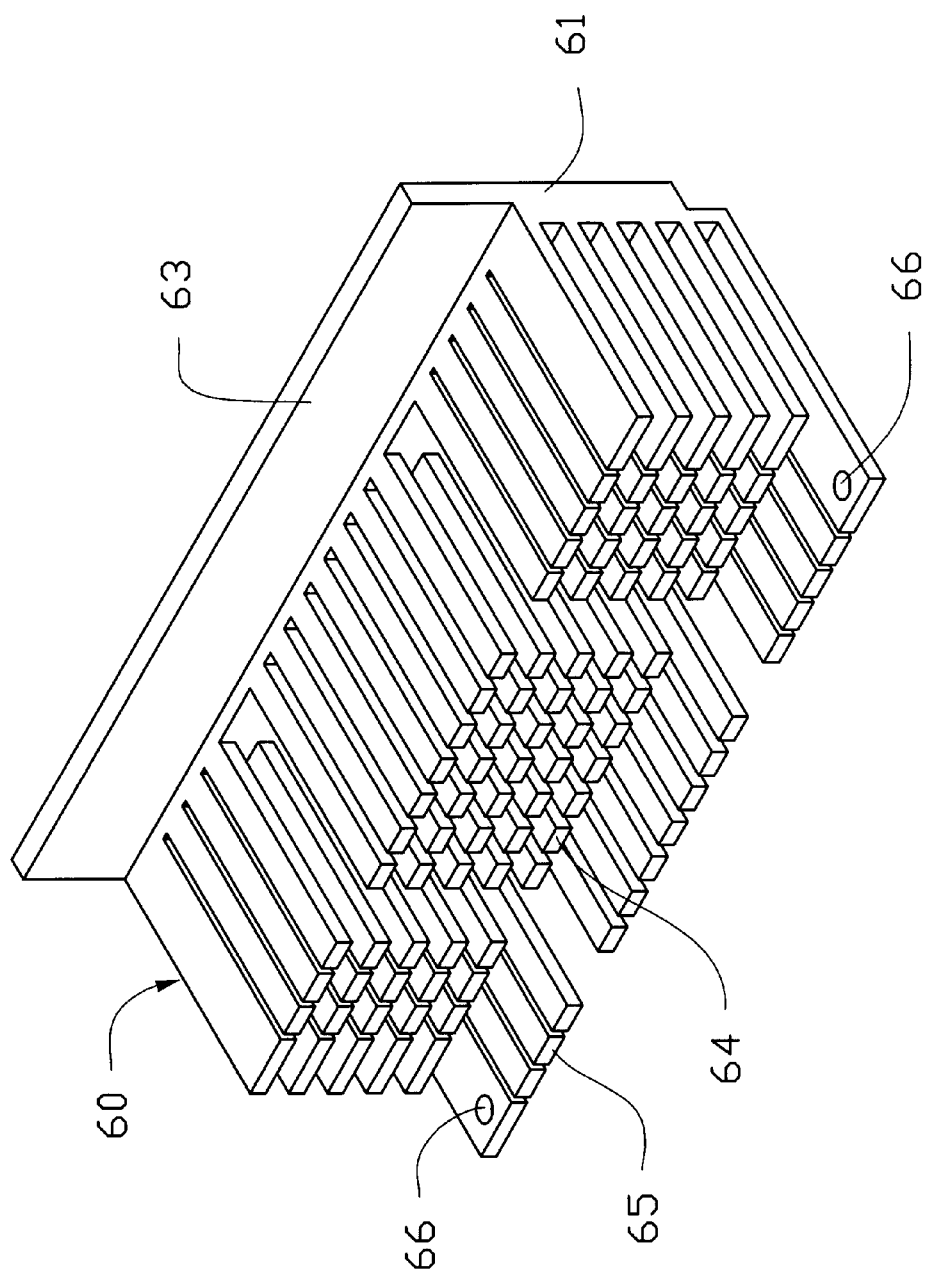
FIG. 4 is a perspective view of the heat dissipation device in accordance with a second embodiment of the present invention.

FIGS. 3 and 4 illustrate a heat dissipating electrical apparatus 400 in accordance with a second embodiment of the present invention which is essentially similar to the first embodiment. The difference between the two embodiments lies in fixing means 50 and in the increased number of second heat dissipation fins 65 of the second embodiment thereby allowing a heavier heat dissipation device 60 to be stably mounted on the substrate 99.

The second fins 65 extend from an entire lower portion of the second surface 63 of the main body 61 of the heat dissipation device 60 and the outermost second fins 65 each define a first hole 66 therein for receiving the fixing means 50.

The fixing means 50 includes two first screws 53, two second screws (not shown), two elongate supports 51 each defining a screw hole (not shown) therethrough, two elongate retaining bars 55 each defining third holes (not shown) at end portions thereof, and two second holes (not shown) defined in the substrate 99 at positions corresponding to the first holes 66 of the outermost second fins 65.

In assembly, the second fins 65 are sandwiched between the retaining bars 55 so that the first holes 66 of the second fins 65 correspond with the third holes of the retaining bars 55. The screw holes of the supports 51 are aligned with each of the first holes 66 of the second fins 65, the second holes of the substrate 99, and the third holes of the retaining bars 55. The first screws 53 are inserted into the third holes of the upper retaining bars 55 for threaded engagement with upper portions of the supports 51. The second screws are inserted into the second holes from a bottom surface of the substrate 99 for threaded engagement with lower portions of the supports 51.

The above disclosures of the two embodiments of the heat dissipating electrical apparatus 200, 400 in accordance with the present invention illustrate that the heat dissipation device 30, 60 is mounted to a substrate 99 at one end and fastened to the heat emitting electrical device 20 at another end thereof so that the heat dissipation device 30, 60 does not exert a significant force on the electrical connector 10 which houses the electrical device 20.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, persons of ordinary skill in this field are to understand that all such equivalent structures are to be included within the scope of the following claims.

We claim:

1. A heat dissipating electrical apparatus comprising:
   a substrate;
   an electrical connector mounted on the substrate;
   a daughter board received in the connector;
   a heat emitting electrical device attached to the daughter board;
   a heat dissipating device attached to the electrical device, having a plurality of heat dissipation fins extending from a main body thereof, the heat dissipation fins including a number of first heat dissipation fins formed in a matrix arrangement and at least one second heat dissipation fin formed to be longer than the first heat dissipation fins; and
   fixing means assembled to the at least one second heat dissipation fin for supportably mounting the heat dissipation device on the substrate wherein said fixing means includes a support with a height as a distance between said second heat dissipation fin and the substrate, defining a screw hole therethrough and supportably sandwiched between said second heat dissipation fin and the substrate.

2. The apparatus as described in claim 1, wherein the at least one second heat dissipation fin defines a first hole proximate a free end thereof for cooperating with the fixing means.

3. The apparatus as described in claim 2, wherein the fixing means includes:
   a first screw;
   a second screw; and
   a second hole defined in the substrate;
   wherein the screw hole of the support is aligned between the first hole of the second heat dissipation fin and the second hole of the substrate, and the first screw is inserted through the first hole of the second heat dissipation fin for threaded engagement with a top portion of the support and the second screw is inserted into the second hole from a bottom surface of the substrate for threaded engagement with a bottom portion of the support.

4. The apparatus as described in claim 1, wherein the second heat dissipation fins extend from a lower portion of the main body of the heat dissipation device.

5. The apparatus as claimed in claim 4, wherein at least two second heat dissipation fins each define a first hole proximate a free end thereof for cooperating with the fixing means.

6. The apparatus as described as described in claim 5, wherein the fixing means includes:
   two elongate retaining bars each defining at least two third holes therein;
   two first screws;
   two second screws; and
   two second holes defined in the substrate;
   wherein the second heat dissipation fins are sandwiched between the retaining bars, the screw hole of each support as aligned with the first hole of the corresponding second heat dissipation fin, the corresponding second hole of the substrate, and the corresponding third holes of the retaining bars, each first screw is inserted through the first hole of the corresponding second heat dissipation fins for threaded engagement with top portions of the corresponding support, and each second screw is inserted into the corresponding second hole from a bottom surface of the substrate for threaded engagement with a bottom portion of the corresponding support.

7. The apparatus as described in claim 6, wherein the first holes are defined in the outermost second heat dissipation fins.

* * * * *